United States Patent [19]
Longeway et al.

[11] Patent Number: 4,761,680
[45] Date of Patent: Aug. 2, 1988

[54] PHOTODETECTOR

[75] Inventors: Paul A. Longeway, East Windsor Township, Mercer County; Ramon U. Martinelli, Hightstown, both of N.J.

[73] Assignee: General Electric Company, Schenectady, N.Y.

[21] Appl. No.: 912,633

[22] Filed: Sep. 29, 1986

[51] Int. Cl.$^4$ .................... H01L 27/14; H01L 31/00
[52] U.S. Cl. ........................................ 357/30; 357/16; 357/56; 357/61
[58] Field of Search ............... 357/30 E, 30 F, 30 D, 357/30 H, 30 B, 16, 56, 61, 52

[56] References Cited

U.S. PATENT DOCUMENTS

| | | | |
|---|---|---|---|
| 4,116,733 | 9/1978 | Olsen et al. | 148/175 |
| 4,328,508 | 5/1982 | Kressel et al. | 357/16 |
| 4,390,889 | 6/1983 | Capasso et al. | 357/30 |
| 4,485,391 | 11/1984 | Poulain et al. | 357/19 |
| 4,499,483 | 2/1985 | Yamazaki et al. | 357/30 |
| 4,544,938 | 10/1985 | Scholl | 357/30 |

OTHER PUBLICATIONS

Trommer, Ninth European Conf. on Optical Comm., ECOC '83, pp. 159-162, 1983.
Stillman et al., IEEE Transactions on Electron Devices, vol. ED-30, No. 4, pp. 364-381, 1983.
Webb et al., IEEE Transactions on Electron Devices, vol. ED-30, No. 4, pp. 395-400, 1983.
Olsen et al., Journal of Electronic Materials, vol. 9, No. 6, pp. 977-987, 1980.
Olsen, Lightwave, Feb., 1986, pp. 31-34.

Primary Examiner—James W. Davie
Assistant Examiner—Georgia Y. Epps
Attorney, Agent, or Firm—Harvey R. Ball; James C. Davis, Jr.; Paul R. Webb, II

[57] ABSTRACT

A photodetector comprising a light absorptive region, a wide bandgap region adjacent to the light absorptive region and a region of a first conductivity type extending through the wide bandgap region into the light absorptive region is improved by the incorporation of a lattice matched, intermediate bandgap region between the wide bandgap region and the light absorptive region. The p-n junction lies in the intermediate bandgap region in proximity to the interface thereof with the light absorptive region. The quantum efficiency of the disclosed device is significantly improved over prior art devices.

12 Claims, 3 Drawing Sheets

PHOTODETECTOR

This invention pertains to an improvement in a photodetector and, particularly, to such a device wherein the p-n junction resides in a region of intermediate bandgap interposed between a light absorptive region and a wide bandgap region.

BACKGROUND OF THE INVENTION

Highly sensitive photodetectors comprised of Group III-V alloys are finding increasing application in the optoelectronics industry. In such a device, incident radiation in the form of photons is absorbed in a light absorptive region resulting in the generation of electron-hole pairs and a detectable current flow. The quantum efficiency, "QE", of such a device is the ratio of the number of electrons in the detectable current flow to the number of photons incident on the device. It will be appreciated that the higher the QE, the more efficient the device. A means of significantly increasing the QE of such sensitive photodetectors is provided in accordance with this invention.

SUMMARY OF THE INVENTION

A photodetector comprising a semiconductor body including a region absorptive of the light to be detected, a portion of which is a first conductivity type, and adjacent thereto a wide bandgap region including a portion of a second conductivity type thereby forming a p-n junction within the device is improved by the addition of a region of an intermediate bandgap latticed matched to and interposed between the light absorptive region and the wide bandgap region. The p-n junction lies in the intermediate bandgap region, suitably in proximity to the light-absorptive region.

DETAILED DESCRIPTION OF THE PREFERRED EMBODIMENTS

This invention relates to a photodetector which is conventionally comprised of a semiconductor body having a light absorption region a portion of which is a first conductivity type and a wide bandgap region a portion of which is a second conductivity type. The p-n junction defined by the first and second conductivity types is within the light absorptive region. The semiconductor body is conventionally comprised of Group III-V alloys. A typical device of this type is illustrated in FIG. 1.

Figure 1:
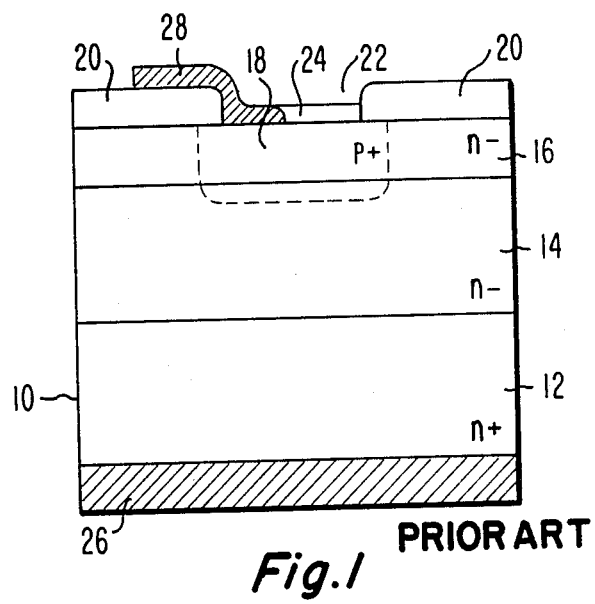
FIG. 1 is a cross sectional view of a photodetector of the prior art.

The prior art device illustrated in FIG. 1 is a top-entry, planar, passivated photodetector. The device consists of a semiconductor body 10 which comprises a substrate or base region 12 having thereover a light absorptive region 14. The base region 12, which may or may not be present depending on the configuration of the device, is suitably a Group III-V binary alloy, such as InP. In the device illustrated in FIG. 1, the substrate region 14 has $n^+$-type conductivity.

The light absorptive region 14 includes a portion of a first conductivity type, in FIG. 1, the zone of $p^+$-type conductivity designated 18. The term "portion" utilized in the context of the first zone of conductivity typically represents from about 1 percent up to about 50 percent of the light absorptive region 14. In all instances, the portion of the first conductivity is sufficient to establish a p-n junction in the light absorptive region 14. The light absorptive region 14 is typically a III-V ternary alloy such as InGaAs.

Overlying the light absorptive region 14 is a wide bandgap region 16 which includes a portion of a second conductivity type. The term "portion" in the context of the wide bandgap region 16 includes from zero up to about 50 percent of the region. In the planar device illustrated in FIG. 1, about 50 percent of the wide bandgap region 16 has the first conductivity type of region 18 with the remainder being the second conductivity type. In a conventional mesa type configuration, not illustrated, the wide bandgap region 16 would be contiguous with the first conductivity type region 18 and the portion of the second conductivity type in the wide bandgap region 16 would be zero. The wide bandgap region 16 is typically a III-V binary alloy, such as InP.

The wide bandgap region 16 serves to reduce both surface recombination of photoelectrically generated electron-hole pairs and the generation of leakage current. In the device illustrated in FIG. 1, the region of first conductivity type 18 is formed contiguous with an opening 22 in a passivating layer 20 which overlies the wide band-gap region 16. The p-n junction extends from the upper surface of the wide bandgap region 16 into the light absorptive region 14 near the interface of regions 14 and 16. The conductivity types may be as illustrated in FIG. 1 or may be reversed so long as the relative conductivity types are maintained. An antireflective layer 24 partially covers the opening 22 in the passivating layer 20. The electrical contacts 26 and 28 on the substrate 12 and the wide bandgap region 16 provide means for contacting the semiconductor body 10.

The light absorptive region 14 is typically between about 2 and 6 micrometers thick and is conventionally comprised of a III-V ternary alloy. For the detection of light in the wavelength range between 0.9 and 1.7 micrometers, $In_{0.53}Ga_{0.47}As$ is a particularly suitable material. The absorptive region, as deposited, is typically undoped and has n-type conductivity in a concentration less than about $5 \times 10^{15}/cm^3$.

The complex Group III-V alloys which typically make up the various layers of the devices described herein may be formed by any conventional process. The subject devices are suitably formed by vapor phase epitaxy utilizing apparatus such as, for example, that disclosed by Olsen et al. in U.S. Pat. No. 4,116,733, issued Sept. 26, 1978, the disclosure of which is incorporated herein by reference.

The region of first conductivity type 18 is typically between about 2 and 3 micrometers in total thickness, extends generally between about 0.25 and 0.75 micrometer into the light absorptive region 14 and may be contiguous with the wide bandgap region 16 depending on the configuration of the device. The region 18 can be formed, for example, by diffusing a p-type dopant, e.g. zinc, through an opening in a masking layer into the wide bandgap region 16. The p-n interface formed by region 18 typically extends through region 16 into the absorptive layer 14. In the device illustrated in FIG. 1, the passivating layer 20, which is typically silicon nitride, is patterned to form an opening 22 through which the region of first conductivity 18 can be formed by diffusion. Alternatively, the region 18 can be formed by other known methods, such as ion implantation followed by an annealing step. The region 18 of first conductivity should contain at least about $10^{17}$ acceptors/cm$^3$. When the region 18 is contiguous with the wide bandgap region 16, as in a mesa device, it may be doped as deposited by conventional methods. Typically, the substrate 12 and the region 18 are light-transmissive and preferably substantially transparent at the wavelength to be detected.

The opening 22 in the passivating layer 20 of the device shown in FIG. 1 is coated with a thin layer, i.e. from about 0.18 to 0.22 nanometer, of an antireflective coating 24, typically of silicon dioxide or silicon nitride. The coating assures that a maximum amount of light enters the device.

An electrical contact 26 contacting the substrate 12 is suitably of a gold-tin alloy when the substrate has n+-type conductivity. An electrical contact 28 contacting the region of first conductivity type 18 is suitably a gold-zinc alloy when the region 18 has p+-type conductivity.

Figure 2:
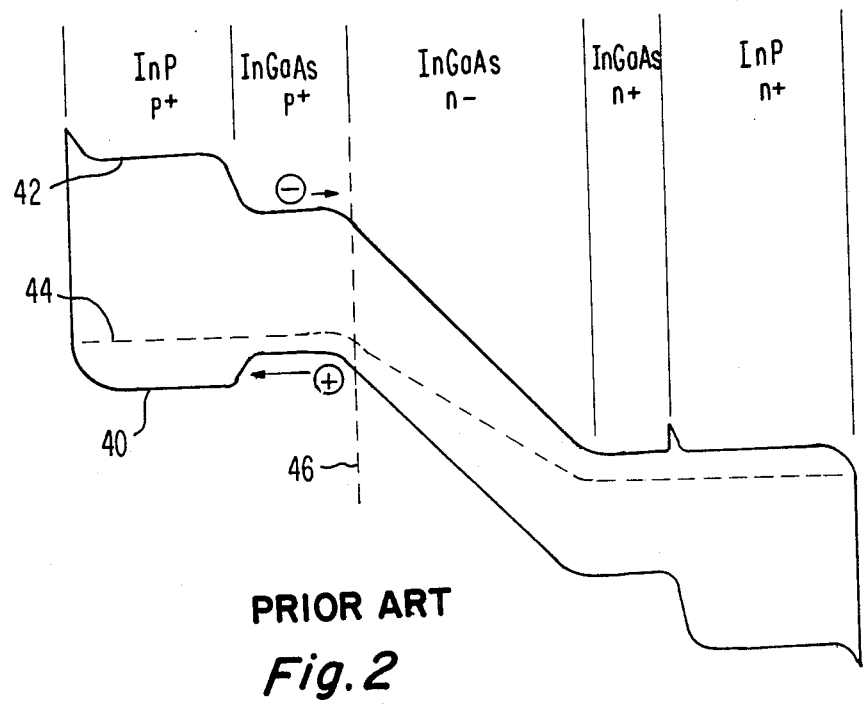
FIG. 2 is an energy-band diagram of a photodetector as illustrated in FIG. 1.

FIG. 2 is an energy-band diagram of the device illustrated in FIG. 1. An energy-band diagram is a representation of the relative energies of holes in a valence band 40 and of electrons in a conduction band 42. The occupancy of either band in a given material is exponentially dependent upon its difference in energy from the Fermi level represented by dotted line 44. The Fermi level is an intrinsic energy value which in n-type semiconductor material will lie close to the conduction band 42 and in p-type semiconductor materials will lie close to the valence band.

In the energy-band diagram of FIG. 2, the portions corresponding to the materials of regions 18, 14 and 12, respectively, from FIG. 1 are indicated. The designation "InGaAs p+" refers to the portion of the region of first conductivity type 18 in the device shown in FIG. 1 which extends into the light absorptive region 14. In operation, electron-hole pairs are generated in the light absorptive InGaAs region 14, particularly the portion thereof which is of the first conductivity type, i.e. p+-type in FIG. 1. There is the opportunity for the generated electrons to recombine before they are swept into the electric field in the direction of the arrow. We have found that the p+-type region in the absorptive region 14 tends to retard electrons flowing toward the n-type regions as illustrated in FIG. 2. The hindrance produced by this effect is detrimental to the quantum efficiency of the device since it increases the opportunity for recombination, thereby reducing the number of electrons which flow across the p-n interface 46.

Therefore, in accordance with this invention, we have produced a significant improvement in photodetectors such as illustrated in FIG. 1, by incorporating therein a region having a bandgap intermediate those of the wide bandgap region 16 and the light absorptive region 14 and lattice matched therewith. The term "lattice match" as conventionally utilized represents a mismatch of less than one-half percent between two regions of material. The percent is the difference in lattice constants of the two regions divided by the lattice constant of one of them.

Figure 3:
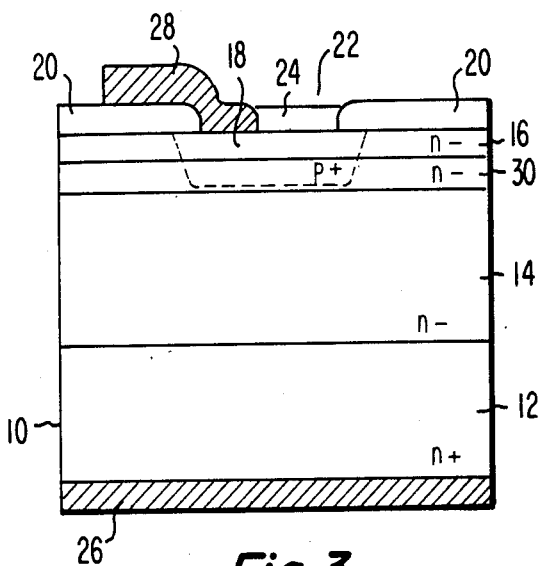
FIGS. 3 and 5 are cross-sectional views of various embodiments of an improved photodetector in accordance with this invention.
Figure 5:
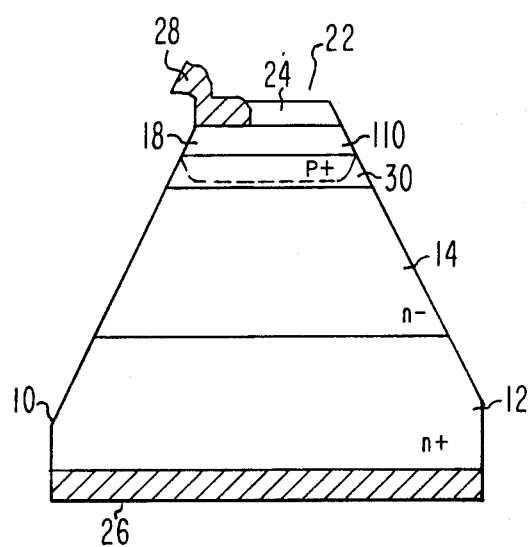

The improved device of this invention is shown in FIG. 3 in the planar configuration. The device of FIG. 3 is similar to that of FIG. 1 with the addition of the intermediate bandgap region 30 between the light absorptive region 14 and the wide bandgap region 16. Region 30 can be a fixed or variable composition and is preferably formed of a III-V quaternary alloy. Particularly suitable alloys are quaternary alloys incorporating the components of regions 14 and 16. When the wide bandgap region 16 is InP and the light absorptive region 14 is InGaAs as described above, intermediate bandgap region 30 preferably has the composition $In_{0.72}Ga_{0.28}As_{0.605}P_{0.395}$. FIG. 5 shows the improved device of this invention in a mesa configuration.

As a result of the presence of the intermediate bandgap region 30, the wide bandgap region 16 is suitably only from about one to one and one-half micrometers thick. Further, the sum of the thicknesses of the intermediate bandgap region 30 and the wide bandgap region 16 is suitably approximately equal to the thickness of the wide bandgap region 16 in the prior art device illustrated in FIG. 1. The intermediate bandgap region 30 may be formed by conventional procedures such as discussed above. In the improved device shown in FIG. 3, the light absorptive region 16 is suitably from about 2 to about 6 micrometers thick.

In the improved device shown in FIG. 3, the p-n interface created by the formation of the region of first conductivity 18 is in the intermediate bandgap region 30 in proximity to the interface thereof and absorptive region 14. By proximity is meant that the p-n interface will be within 0.4 micrometer of the interface between regions 30 and 14.

Figure 4:
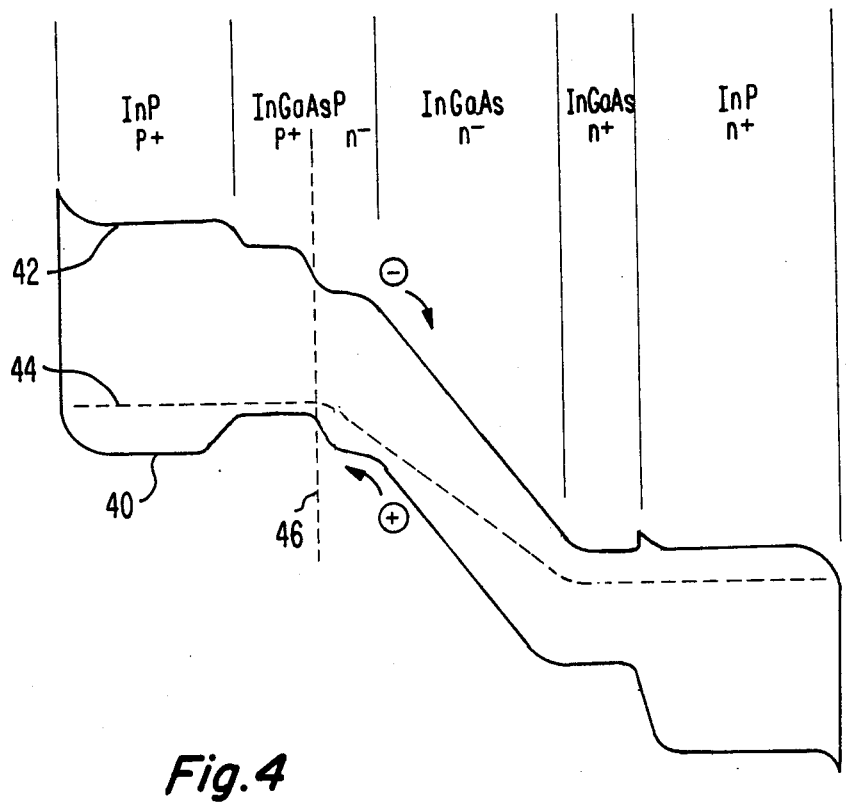
FIG. 4 is an energy-band diagram of a photodetector as illustrated in FIG. 3.

FIG. 4 is an energy-band diagram of the device shown in FIG. 3 with all designations having the same meanings. It is clearly evident by comparing FIGS. 2 and 4 that the p+-type conductivity region in the absorptive layer 14 in FIG. 2, which tends to retard the flow of electrons through the p-n junction 50, has been eliminated by the presence of the intermediate bandgap region 30 of the subject device. The energy-band diagram shown in FIG. 4 is more conductive to the flow of electrons into the n+-type conductivity region than that shown in FIG. 2 since the electrons are created in a high field region as opposed to a p+-type conductivity region. Therefore, the electrons are quickly swept away by the electric field with no inhibition, thus virtually eliminating the opportunity for recombination of the electron-hole pairs. This effect is manifest by the fact that, while the device shown in FIG. 1 has an acceptable QE of about 75 percent, devices of this invention have unexpectedly demonstrated a substantially improved QE of about 96 percent.

Alternatively, it is possible that the substantial improvement in QE arises because the disclosed device reduces the amount of light which is absorbed but does not generate electrical current. In the prior art embodiment of FIG. 1, light passes through the antireflection layer 24, into the wide bandgap region 16 which absorbs a percentage of short typically unnecessary wavelengths of light. The remaining light travels into the p+ region of the light absorptive region 14. Since the p+ conductivity regions absorb light but do not generate electrical current from the absorption, a substantial amount of light having wavelengths less than 1.7 μm will be absorbed without generating electrical current. In contrast, when the p-n junction is placed within close proximity of an intermediate bandgap region 30, any non current generating absorption will primarily occur in the intermediate bandgap region 30. Therefore, longer more useful wavelengths of light may travel into the n-conductivity current since the intermediate bandgap region 30 absorbs shorter wavelengths of light than the light absorptive region 14.

The improved photodetector of this invention has been described and illustrated principally with regard to a top-entry, planar, passivated p-i-n device. It is equally applicable to other art-recognized devices of a similar makeup having differing configuration such as top-entry, mesa, p-i-n devices, substrate- or bottom-entry, planar, passivated devices and the like.

The invention has been described with reference to preferred embodiments thereof. It will be appreciated by those skilled in the art that various modifications may be made from the specific details given without departing from the spirit and scope of the invention.

We claim:

1. A photodetector comprising:
   a light absorptive layer;
   a wide bandgap layer;
   an intermediate bandgap layer of a first conductivity type interposed between and lattice matched to said light absorptive layer and said wide bandgap layer, said intermediate bandgap layer having a bandgap intermediate to said wide bandgap and said light absorptive layer;
   a zone of a second conductivity type extending throuth said wide bandgap layer into said intermediate bandgap layer and forming a p-n junction in said intermediate bandgap layer;
   a means for electrically contacting said light absorptive layer and a means for electrically contacting said wide bandgap layer.

2. A photodetector in accordance with claim 1, additionally including a base region adjacent to the light absorptive region.

3. A photodetector in accordance with claim 2, wherein the base region and the wide bandgap region are a binary III-V alloy.

4. A photodetector in accordance with claim 3, wherein the binary alloy is InP.

5. A photodetector in accordance with claim 1, wherein the light absorptive region is a III-V ternary alloy.

6. A photodetector in accordance with claim 5, wherein the alloy is n-type InGaAs, the wide bandgap region is n-type InP and the portion of a first conductivity type is $p^+$.

7. A photodetector in accordance with claim 1, wherein the intermediate bandgap region is a III-V quaternary alloy.

8. A photodetector in accordance with claim 7, wherein the alloy is InGaAsP.

9. A photodetector in accordance with claim 1, having a planar configuration, wherein said first conductivity type is $p^+$, said second conductivity type is $n^-$ and the wide bandgap region is n-type InP.

10. A photodetector in accordance with claim 1 having a mesa configuration wherein the wide bandgap region is said first conductivity type.

11. A photodetector in accordance with claim 1, wherein the p-n junction is proximate to the interface of the intermediate bandgap region and the light absorptive region.

12. A photodetector in accordance with claim 11, wherein the p-n junction is within 0.4 micrometer of said interface.

* * * * *